United States Patent [19]
Loo

[11] Patent Number: 5,818,682
[45] Date of Patent: Oct. 6, 1998

[54] METHOD AND APPARATUS FOR OPTIMIZING A DECHUCKING PERIOD USED TO DECHUCK A WORKPIECE FROM AN ELECTROSTATIC CHUCK

[75] Inventor: David H. Loo, San Jose, Calif.

[73] Assignee: Applied Materials, Inc., Santa Clara, Calif.

[21] Appl. No.: 696,293

[22] Filed: Aug. 13, 1996

[51] Int. Cl.$^6$ .................................................. H02N 13/00
[52] U.S. Cl. ........................................... 361/234; 279/128
[58] Field of Search ..................... 361/233, 234, 361/235, 230; 279/128

[56] References Cited

U.S. PATENT DOCUMENTS

| | | | |
|---|---|---|---|
| 4,113,380 | 9/1978 | Walter | 355/75 |
| 4,864,461 | 9/1989 | Kasahara | 361/234 |
| 5,001,594 | 3/1991 | Bobbio | 361/234 |
| 5,117,121 | 5/1992 | Watanabe et al. | 307/130 |
| 5,315,473 | 5/1994 | Collins et al. | 361/234 |
| 5,325,261 | 6/1994 | Horwitz | 361/234 |
| 5,444,597 | 8/1995 | Blake et al. | 361/234 |
| 5,459,632 | 10/1995 | Birang et al. | 361/234 |
| 5,491,603 | 2/1996 | Birang et al. | 361/234 |
| 5,612,850 | 3/1997 | Birang et al. | 361/234 |

FOREIGN PATENT DOCUMENTS

WO 88/09054   11/1988   WIPO ........................... H01L 21/68

*Primary Examiner*—Fritz Fleming
*Attorney, Agent, or Firm*—Donald Verplancken; Raymond R. Moser

[57] ABSTRACT

A method and apparatus which predicts an optimal period over which a dechucking voltage is applied to an electrostatic chuck to achieve dechucking of a workpiece therefrom. Specifically, the method is implemented as a software program that is executed by a conventional computer. The method applies an optimal dechucking voltage for an optimal dechucking period to dechuck the workpiece. To avoid charge accumulation on the electrostatic chuck when processing a succession of workpieces, the chucking and dechucking voltages reverse polarity after each workpiece is dechucked.

22 Claims, 3 Drawing Sheets

METHOD AND APPARATUS FOR OPTIMIZING A DECHUCKING PERIOD USED TO DECHUCK A WORKPIECE FROM AN ELECTROSTATIC CHUCK

BACKGROUND OF THE DISCLOSURE

1. Field of the Invention

The invention relates to electrostatic chucks for holding a workpiece and, more specifically, to a method and apparatus for dechucking a workpiece from an electrostatic chuck.

2. Description of the Background Art

Electrostatic chucks are used for holding a workpiece in various applications ranging from holding a sheet of paper in a computer graphics blotter to holding a semiconductor wafer within a semiconductor fabrication process system. Although electrostatic chucks vary in design, they all are based on the principal of applying a voltage to one or more electrodes in the chuck so as to induce opposite polarity charges in the workpiece and electrode(s), respectively. The electrostatic attracted force between the opposite charges presses the workpiece against the chuck, thereby retaining the workpiece.

A problem with electrostatic chucks is the difficulty of removing the electric charge from the workpiece and the chuck when it is desired to release the workpiece from the chuck. One conventional solution is to connect both the electrode and the workpiece to ground to drain the charge. However, the charge trapped into the dielectric material cannot be drained freely. Another conventional solution, which purportedly removes the charge more quickly, is to reverse the polarity of DC voltage applied to the electrodes. This technique is described in the context of a chuck having two electrodes (a bipolar chuck) in U.S. Pat. No. 5,117,121 issued May 26, 1992 to Watanabe, et al.

A shortcoming that has been observed with these conventional approaches to removing the electric charge is that they fail to completely remove the charge, so that some electrostatic force remains between the workpiece and the chuck. This residual electrostatic force necessitates the use of a large mechanical force to separate the workpiece from the chuck. When the workpiece is a semiconductor wafer, the force required for removal sometimes cracks or otherwise damages the wafer. Even when the wafer is not damaged, the difficulty of mechanically overcoming the residual electrostatic force sometimes causes the wafer to pop off the chuck unpredictably into a position from which it is difficult to retrieve by a conventional wafer transport robot.

To more accurately reduce the residual electrostatic attractive force that remains between the workpiece and the chuck, attempts have been made to optimize the dechucking voltage by performing measurements upon the chucked wafer to determine an optimal dechucking voltage. One such active dechucking arrangement is disclosed in commonly assigned U.S. Pat. No. 5,459,632 issued Oct. 17, 1995 to Birang, et al. This dechucking method, like most optimizing type dechucking methods, optimizes the magnitude of the dechucking voltage but does not compute an optimal duration for applying that voltage to the electrostatic chuck. As such, these systems may attain an optimal dechucking voltage for a given dechucking period, but this combination of dechucking voltage and dechucking period may not be optimal for dechucking the wafer.

Additionally, when successively processing a plurality of workpieces, previous chucking/dechucking methods apply the same polarity voltages for each chuck/dechuck cycle. This leads to chuck dielectric polarization and an accumulation of residual charge on the chuck surface. The result is increasing difficulty in dechucking each successive workpiece.

Therefore, there is a need in the art for a method and apparatus that applies a dechucking voltage for an optimal dechucking period and minimizes charge accumulation upon the chuck surface when successively processing a plurality of workpieces.

SUMMARY OF THE INVENTION

The disadvantages heretofore associated with the prior art are overcome by the present invention of a method and apparatus that determines an optimal period over which a dechucking voltage is applied to an electrostatic chuck to achieve dechucking of a workpiece therefrom. Specifically, the method of the present invention is implemented as a software program that is executed by a conventional computer. The invention measures and stores the chucking voltage and the chucking period within a memory of the computer system. From the chucking voltage, the method determines the dechucking voltage. Typically, for a workpiece such as an oxide wafer, the dechucking voltage is negative one and a half times the magnitude of the chucking voltage. However, the dechucking voltage could also be computed using any one of the many available dechucking voltage optimization algorithms available in the prior art.

The dechuck period is determined from a computation of "areas" defined by the magnitude of the chucking and dechucking voltages multiplied by the application duration of each voltage. For example, the chucking "area" is defined by the absolute value of the chucking voltage times the chucking period. The dechucking area is defined by the absolute value of the dechucking voltage times the dechucking period. An area ratio is determined by dividing the dechucking area by the chucking area. Typically, for a chucking period of 30 to 75 seconds, an optimal area ratio has been found to be approximately 0.1. The dechucking period is equal to the area ratio divided by voltage ratio multiplied by the chucking period. The voltage ratio is defined as the absolute value of the dechucking voltage divided by the absolute value of the chucking voltage. Empirically, this ratio value has been found to be 1.5, however, this value may change as the dechucking voltage is optimized for a particular chuck apparatus and a particular type of workpiece. Using the area ratio of 0.1 and a voltage ratio of 1.5, the dechucking period is 0.0667 times the chucking period.

Once the dechucking voltage and the dechucking period have been determined, the method applies the dechucking voltage for a period equal to the dechucking period to discharge the residual charge that remains between the workpiece and the electrostatic chuck. After the dechucking period has expired, the dechucking voltage is disconnected, and the workpiece is physically removed from the electrostatic chuck. This process of dechucking the workpiece is accomplished after each workpiece is processed within the system such that a residual charge does not accumulate upon the electrostatic chuck from workpiece to workpiece. To minimize charge accumulation, the polarity of the chucking and dechucking voltages are reversed after each workpiece is dechucked.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
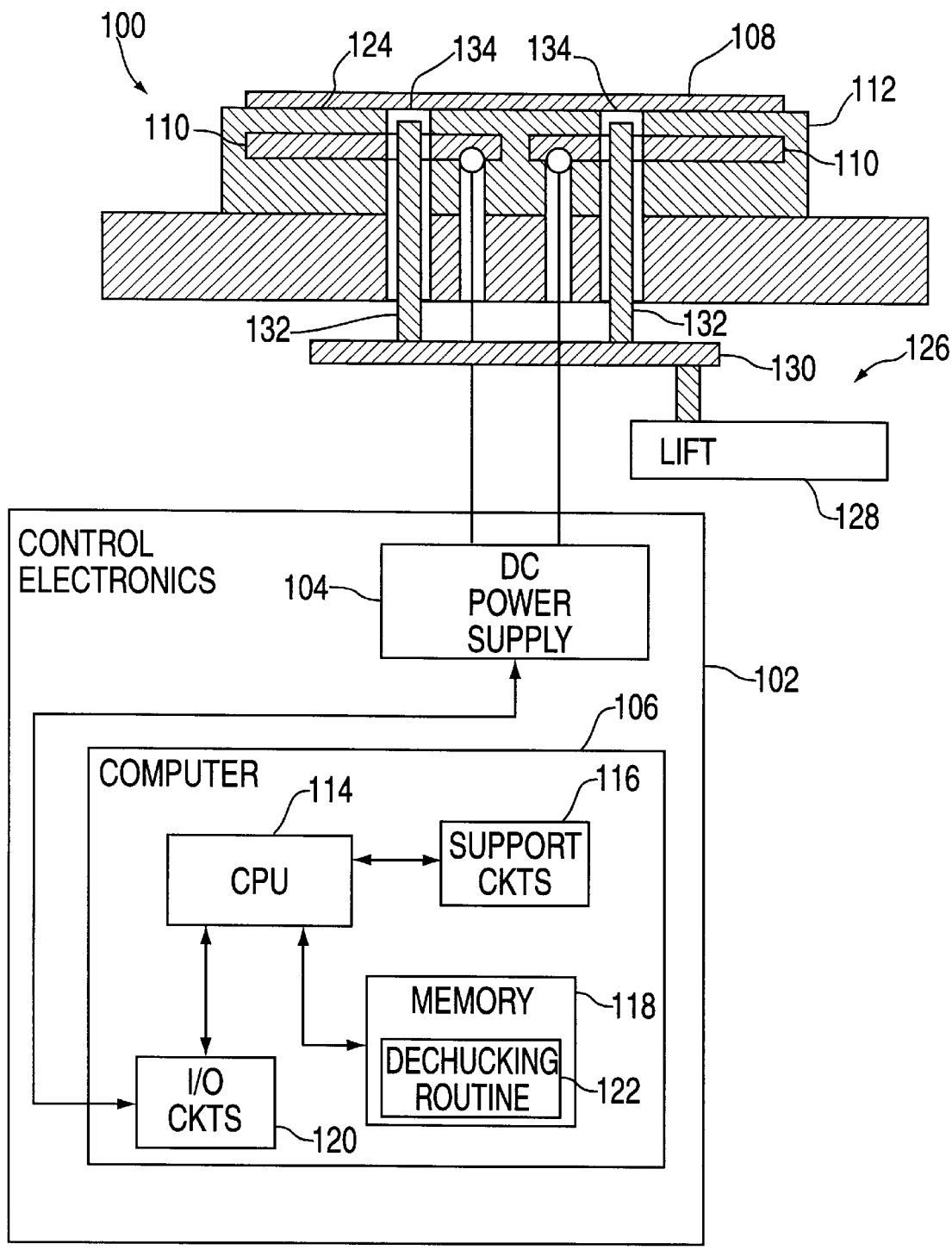
FIG. 1 depicts a sectional view, partially in schematic form, of a conventional electrostatic chuck coupled to a general purpose computer that is programmed to execute the method of the present invention.

FIG. 1 depicts an electrostatic chuck 100 coupled to control circuitry 102. The electrostatic chuck that is depicted is a bipolar chuck having a pair of coplanar electrodes 110 embedded within a dielectric chuck body 112 that forms a support surface 124 upon which the chuck retains a workpiece 108, e.g., a semiconductor wafer. Although a bipolar chuck is depicted, those skilled in the art will realize from the following discussion that the present invention may be used with any type of electrostatic chuck, including monopolar chucks, dielectric chucks, ceramic chucks, and the like.

In a semiconductor processing system, the electrostatic chuck 100 is enclosed within a vacuum chamber (not shown). To facilitate positioning a workpiece 108 upon the support surface 124 of the chuck, a conventional lift assembly 126 is used. The lift assembly contains a pneumatic lift 128, a carriage 130, and a plurality of lift pins 132. The lift pins extend through bores 134 in the chuck body 112 to the surface 124 such that one end of each lift pin (e.g., the tip of each pin) can contact the underside of the workpiece 108. When extended, the lift pins protrude from the surface 124 by 2 to 5 cm. The other end of each lift pin is attached to the carriage 130 and the carriage is attached to the pneumatic lift 128. In operation, the pneumatic lift causes the lift pins to extend from the surface of the electrostatic chuck and a robotic workpiece transport (not shown, but well known in the art) places a workpiece upon the protruding pins. The pneumatic lift then retracts the lift pins into the chuck such that the pins descend into the electrostatic chuck 100 leaving the workpiece resting upon the surface 124 of the chuck 100. After the workpiece is chucked, processed, and dechucked, in the manner described below, the lift assembly 126 raises the lift pins 132 from the electrostatic chuck 100 such that the workpiece is spaced apart from the chuck surface 124. The robotic workpiece transport can then remove the workpiece from the pins.

The control electronics 102 contains a DC power supply 104 that is controlled by a computer 106. The DC power supply produces a variable positive and a negative voltage for each electrode of the bipolar chuck. In general, the computer 106 sets the output voltage value of the DC power supply 104. The computer 106 is a general purpose, programmable computer system containing a central processing unit (CPU) 114 connected to conventional support circuits 116 such as a power supply, storage devices, timing circuits, and the like. In addition, the CPU is connected to memory circuits 118 such as read-only memory (ROM) and random access memory (RAM). Furthermore, the RAM temporarily stores such values as the chucking voltage and the chucking period that are used during wafer processing. The present invention is implemented as a software program stored in memory 118 as dechucking routine 122. Upon execution of this dechucking routine, the computer system becomes an apparatus used for controlling the DC power supply to dechuck the workpiece in accordance with the operational steps of the dechucking routine.

Figure 2:
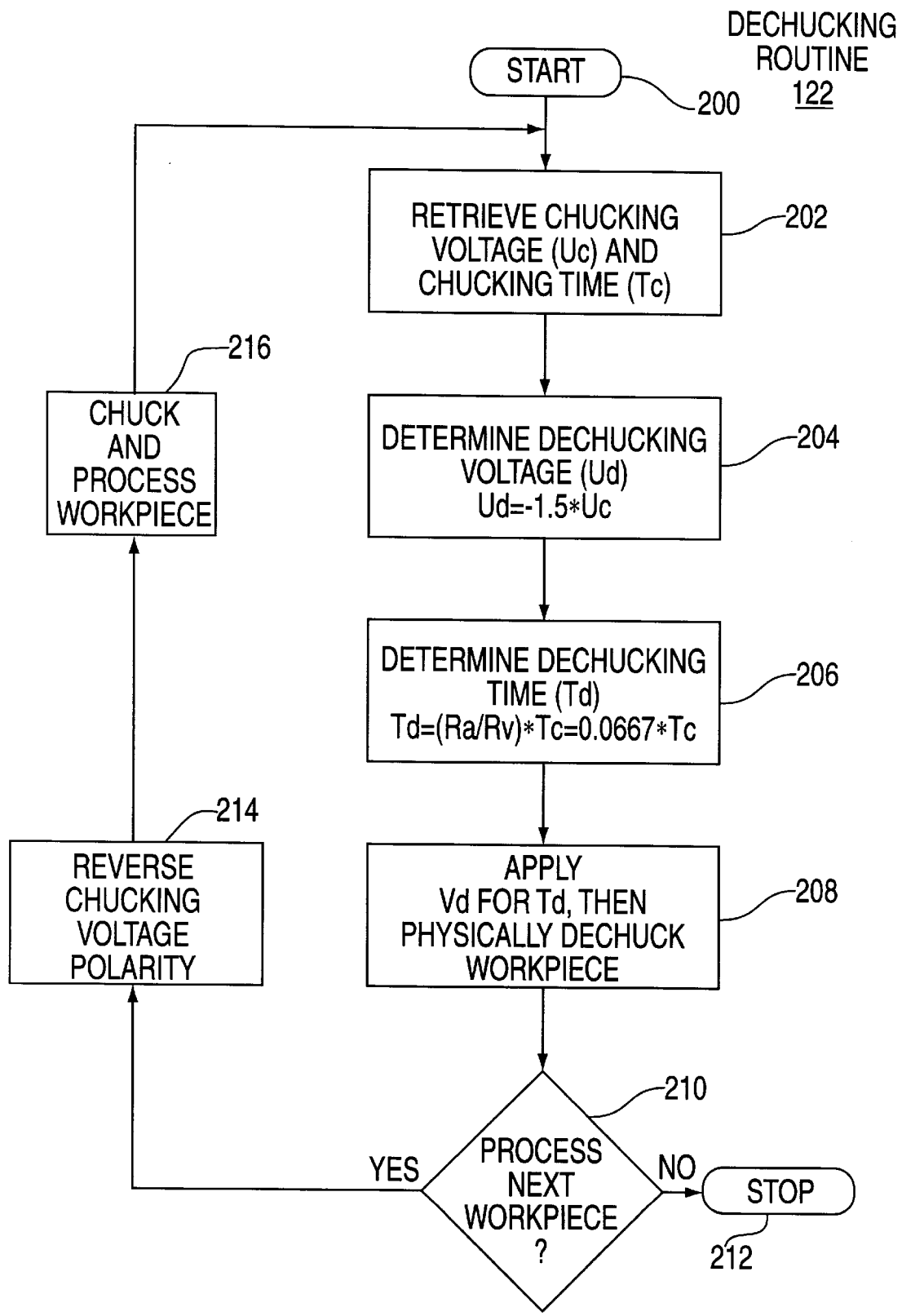
FIG. 2 depicts a flow diagram of the method of the present invention.

FIG. 2 depicts a flow diagram of the dechucking routine 122. The dechucking routine begins at step 200 and proceeds to step 202. At step 202, the routine retrieves the chucking voltage and chucking period from memory within the computer system. At step 204, the routine computes the dechucking voltage. The dechucking voltage is typically −1.5 times the chucking voltage for a workpiece such as an oxide wafer. However, the dechucking voltage may be computed by any one of a number of available dechucking voltage optimization methods that are available in the art. One such method is described in commonly assigned U.S. Pat. No. 5,459,632 issued Oct. 17, 1995 to Birang, et al. Once the chucking voltage has been computed, the routine proceeds to step 206.

At step 206, the routine computes a duration for which the dechucking voltage computed in step 204 is to be applied to the electrostatic chuck. The dechucking period is calculated using an "area" ratio $R_a$, a voltage ratio $R_v$, and the chucking period $T_c$. The area ratio $R_a$ is defined using equation 1 below:

$$R_a = (|U_d| \cdot T_d)/(|U_c| \cdot T_c) \qquad (1)$$

where:

$U_d$ is the dechucking voltage;

$T_d$ is the dechucking period;

$U_c$ is the chucking voltage;

$T_c$ is the chucking period.

Empirical analysis has shown that when the chucking period is approximately 30 to 75 seconds, the optimized area ratio converges to 0.1. The optimal value of $R_a$ varies with chuck design and materials. Thus, the value is typically determined for a particular chuck, then used repeatedly to determine a dechucking period for dechucking subsequently processed wafers. To determine an optimal value of $R_a$, various combinations of chucking voltage, chucking period, dechucking voltage, dechucking period and temperature are used to chuck/dechuck a wafer. For each combination, the wafer is removed and the potential of the residual charge is measured using a static voltage probe. This process of changing the chucking and dechucking parameters and measuring the resultant residual charge is repeated until a $R_a$ value is determined that results in a minimal residual charge.

The computation of the dechucking period also includes a value known as the voltage ratio that is defined as follows in equation 2:

$$R_v = |U_d|/|U_c| \qquad (2)$$

Empirical study has shown that the optimized voltage ratio $R_v$ is equal to 1.5 for oxide wafers. Thus, the dechucking period is related to the chucking period by equation 3 below:

$$T_d = (R_a/R_v) \cdot T_c \qquad (3)$$

When the area ratio is equivalent to 0.1 and the voltage ratio is equivalent to 1.5, the ratio of $R_a/R_v$ is 0.0667. Consequently, at step 206, using the optimized values, the dechucking period is 0.0667 times the chucking period.

At step 208, the computer system sends a control signal to the DC voltage supply to apply the dechucking voltage for a period equal to the dechucking period. At this point, the dechucking process is complete and the workpiece may be physically removed from the electrostatic chuck.

To optimally dechuck wafers that are successively processed, the foregoing method should be applied after each wafer is processed within a wafer processing system containing the electrostatic chuck. Thus, at step 210, the routine queries whether another workpiece (wafer) is to be processed. If the query is negatively answered, the routine proceeds to step 212. However, if the query is affirmatively answered, the routine proceeds to step 214. To further improve the dechucking process the chucking voltage should be reversed in polarity after each wafer is processed. If the polarity is not reversed, the dielectric material of the chuck becomes polarized and dechucking becomes progressively more difficult. Therefore, at step 214, the polarity of chucking voltage is reversed and, at step 216, the next workpiece is processed. To dechuck the workpiece, the routine proceeds to step 202.

Figure 3:
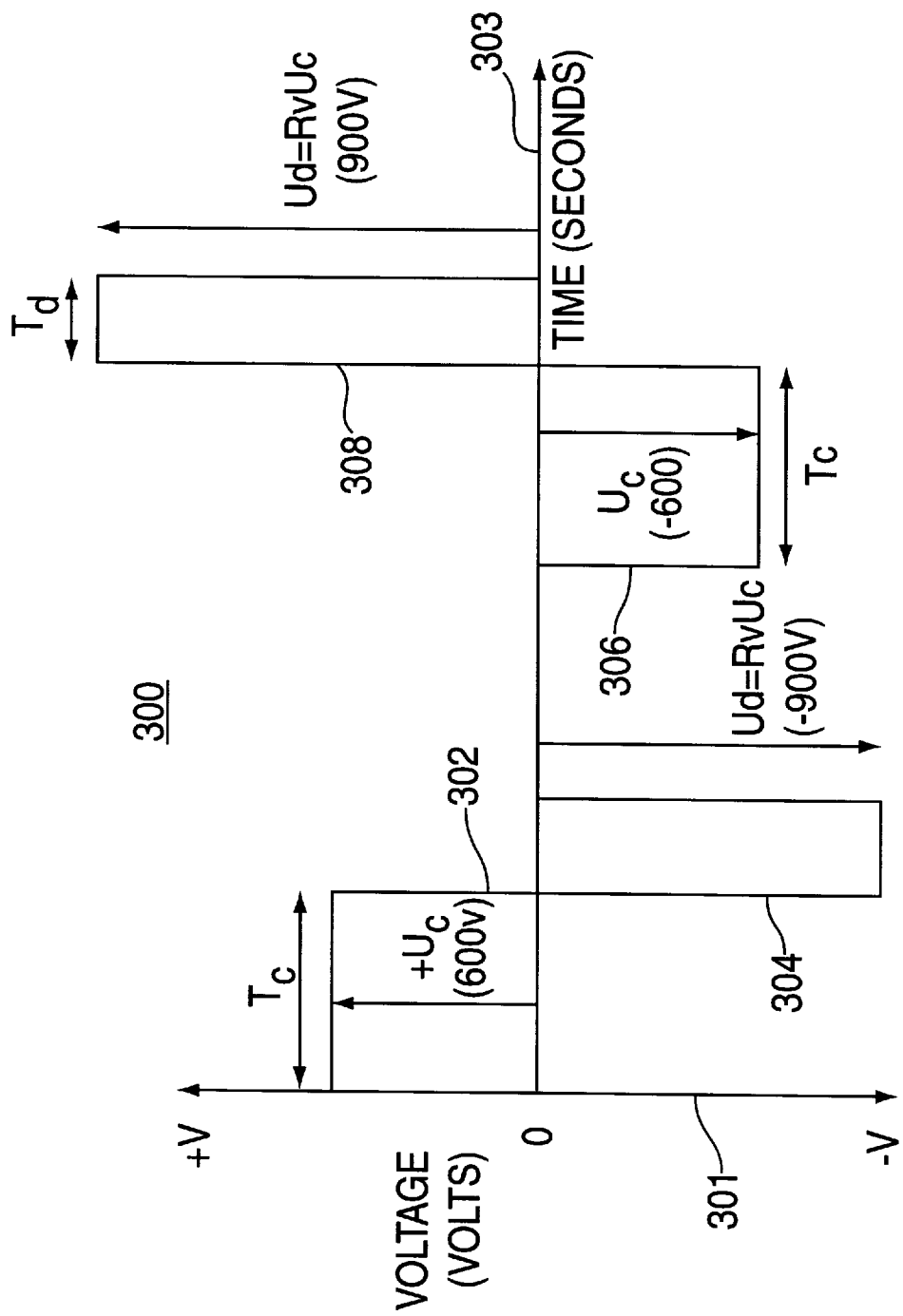
FIG. 3 depicts a timing diagram of the chucking and dechucking voltages applied to an electrostatic chuck in accordance with the present invention.

FIG. 3 depicts a timing diagram 300 of the application of the chucking and dechucking voltage for a succession of wafers. The timing diagram 300 has a voltage axis 301 and a time axis 303. As shown in FIG. 3, the first portion 302 of the graph 300 depicts a period of time ($T_c$) for chucking the wafer having a positive voltage. The $V_c$ is the chucking voltage, e.g., 600 volts DC. Immediately following the chucking period is the dechucking period 304 ($T_d$) that is computed using the dechucking routine 122 and typically applies a negative voltage having a magnitude of $V_d$ (e.g., −900 VDC) for a duration of $T_d$. Once the wafer to which these voltages are applied is removed from the electrostatic chuck, another wafer is placed on the chuck for processing and the chucking voltage 306 is applied using a voltage that is oppositely polarized with respect to the previously used chucking voltage 302, e.g., the new voltage is −600 volts DC. This voltage is applied for a predefined duration equal to the chucking period $T_c$. The dechucking voltage 308 is then applied as calculated using the dechucking routine for the computed dechucking period $T_d$. The voltage applied is generally optimized to be −1.5 times the chucking voltage, e.g., 900 volts DC. This technique of reversing the polarity of the chucking voltage after each wafer is processed substantially decreases the amount of residual charge that remains upon the electrostatic chuck after each wafer is processed. Consequently, the residual charge is not accumulated on the chuck surface over time and dielectric material polarization is avoided.

Although a single embodiment incorporating the teachings of the present invention has been shown and described in detail, those skilled in the art can readily devise many other varied embodiments that still incorporate these teachings.

What is claimed is:

1. In a system that retains a workpiece, a method of chucking and dechucking said workpiece to/from an electrostatic chuck comprising the steps of:

positioning a workpiece upon said electrostatic chuck;

applying a chucking voltage to said electrostatic chuck for a chucking period;

applying a dechucking voltage to the electrostatic chuck for a period equivalent to a dechucking period, where said dechucking period is optimized with respect to a predefined optimization constant and the chucking period to provide a minimal residual charge on the electrostatic chuck; and removing the workpiece from the electrostatic chuck.

2. The method of claim 1 wherein the dechucking period is equivalent to a constant times the chucking period.

3. The method of claim 2 wherein said constant is 0.0667.

4. The method of claim 1 wherein the dechucking voltage has a polarity opposite the polarity of the chucking voltage.

5. The method of claim 1 wherein the dechucking voltage is equivalent to −1.5 times the chucking voltage.

6. A method of dechucking a workpiece from an electrostatic chuck, where the workpiece has been retained by the electrostatic chuck using a chucking voltage that is applied to the electrostatic chuck for a chucking period, the method comprising the steps of:

determining a dechucking voltage;

determining a dechucking period that is related to a chucking period through a predefined optimization constant to provide a minimal residual charge on the electrostatic chuck; and applying the dechucking voltage to the electrostatic chuck to a period of time equivalent to the dechucking period.

7. The method of claim 6 wherein said dechucking period is related to said chucking period by the following relationship:

$$Td=(Ra/Rv)Tc$$

where:

Ra/Rv is the predefined optimization constant;

Ra is a known area ratio having the form Ra=(|Ud'|Td')/(|Uc'|Tc');

Ud' is an optimized dechucking voltage;

Td' is an optimized dechucking period;

Uc' is an optimized chucking voltage;

Tc' is an optimized chucking period;

Rv is a voltage ratio having the form Rv=|Ud'|/|Uc'|.

8. The method of claim 7 wherein said area ratio and said voltage ratio are empirically optimized to achieve minimal residual charge upon the electrostatic chuck.

9. The method of claim 7 wherein $R_a$ equals 0.1.

10. The method of claim 7 wherein $R_a/R_v$ equals 0.0667.

11. The method of claim 6 wherein the dechucking voltage is equivalent to −1.5 times the chucking voltage.

12. In a system that retains a workpiece, apparatus for chucking and dechucking said workpiece to/from an electrostatic chuck comprising the steps of:

means for positioning a workpiece upon said electrostatic chuck;

a voltage source, connected to said electrostatic chuck, for applying a chucking voltage to said electrostatic chuck for a chucking period and for applying a dechucking voltage to the electrostatic chuck for a period equivalent to a dechucking period, where said dechucking period is optimized with respect to a predefined optimization constant and the chucking period to provide a minimal residual charge on the electrostatic chuck; and means for removing the workpiece from the electrostatic chuck.

13. The apparatus of claim 12 wherein the dechucking period is equivalent to a constant times the chucking period.

14. The apparatus of claim 13 wherein said constant is 0.0667.

15. The apparatus of claim 12 wherein the dechucking voltage has a polarity opposite the polarity of the chucking voltage.

16. The apparatus of claim 12 wherein the dechucking voltage is equivalent to −1.5 times the chucking voltage.

17. Apparatus for dechucking a workpiece from an electrostatic chuck, where the workpiece has been retained by the electrostatic chuck using a chucking voltage that is applied to the electrostatic chuck for a chucking period, the apparatus comprising:

means for determining a dechucking voltage;

means for determining a dechucking period that is related to a chucking period through a predefined optimization constant to provide a minimal residual charge on the electrostatic chuck; and a voltage source, connected to said electrostatic chuck, for applying the dechucking voltage to the electrostatic chuck to a period of time equivalent to the dechucking period.

18. The apparatus of claim 17 wherein said dechucking period is related to said chucking period by the following relationship:

$$Td=(Ra/Rv)Tc$$

where:

Ra/Rv is the predefined optimization constant:

Ra is a known area ratio having the form $Ra=(|Ud'|Td')/(|Uc'|TC')$;

Ud' is an optimized dechucking voltage;

Td' is an optimized dechucking period;

Uc' is an optimized chucking voltage;

Tc' is an optimized chucking period;

Rv is a voltage ratio having the form $Rv=|Ud'|/|Uc'|$.

19. The apparatus of claim 18 wherein said area ratio and said voltage ratio are empirically optimized to achieve minimal residual charge upon the electrostatic chuck.

20. The apparatus of claim 18 wherein $R_a$ equals 0.1.

21. The apparatus of claim 18 wherein $R_a/R_v$ equals 0.0667.

22. The apparatus of claim 17 wherein the dechucking voltage is equivalent to −1.5 times the chucking voltage.

* * * * *